(12) United States Patent
Kuusilinna et al.

(10) Patent No.: US 7,852,138 B2
(45) Date of Patent: Dec. 14, 2010

(54) THERMAL SENSORS FOR STACKED DIES

(75) Inventors: Kimmo Kuusilinna, Berkeley, CA (US); Jani Klint, Tampere (FI); Tapio Hill, Helsinki (FI)

(73) Assignee: Nokia Corporation, Espoo (FI)

( * ) Notice: Subject to any disclaimer, the term of this patent is extended or adjusted under 35 U.S.C. 154(b) by 102 days.

(21) Appl. No.: 12/306,450

(22) PCT Filed: Dec. 24, 2007

(86) PCT No.: PCT/IB2007/004090

§ 371 (c)(1),
(2), (4) Date: Mar. 6, 2009

(87) PCT Pub. No.: WO2009/081225

PCT Pub. Date: Jul. 2, 2009

(65) Prior Publication Data

US 2010/0231286 A1    Sep. 16, 2010

(51) Int. Cl.
*H01L 35/00* (2006.01)
(52) U.S. Cl. .................................................... 327/513

(58) Field of Classification Search ............. 327/512, 327/513, 564, 565
See application file for complete search history.

(56) References Cited

U.S. PATENT DOCUMENTS

| | | | |
|---|---|---|---|
| 6,996,491 B2 * | 2/2006 | Gold et al. ............... | 702/132 |
| 2003/0102556 A1 | 6/2003 | Moriguchi et al. | |
| 2005/0231925 A1 | 10/2005 | Fukuda et al. | |
| 2006/0265174 A1 | 11/2006 | Doyle et al. | |
| 2007/0145578 A1 | 6/2007 | Lee | |

OTHER PUBLICATIONS

International Search Report for International Application No. PCT/IB2007/004090.
Written Opinion of the International Searching Authority for International Application No. PCT/IB2007/004090.

* cited by examiner

*Primary Examiner*—Jeffrey S Zweizig
(74) *Attorney, Agent, or Firm*—Alston & Bird LLP (57) ABSTRACT

The invention relates to a method for obtaining temperature values from at least two thermal sensors arranged on resources within a three-dimensional die structure determining at least a partial three-dimensional temperature distribution for said die structure and controlling activity of said resources of said dies in response to said three-dimensional temperature distribution.

37 Claims, 11 Drawing Sheets

THERMAL SENSORS FOR STACKED DIES

TECHNICAL FIELD

The present invention is related to thermal sensing in integrated circuits, and in particular to methods and devices for thermal control in three-dimensional die structures.

BACKGROUND

Semiconductor dies are widely used for a large number of applications, such as microcontrollers, memory elements and other integrated circuits (ICs). Especially in portable devices, size has become an issue despite the minimal dimensions of these dies. When a large number of memory units and other elements are required in a device, both the covered area as well as the interconnection between several dies is a problem. Therefore, solutions are developed which include three-dimensional die architectures, i.e. a number of dies is stacked on top of each other within a single chip package, also known as 3D ICs. This technology has significant advantages including increased packaging density, increased number of possible connections between the dies, and reduced energy consumption due to lower interconnect capacitances.

Operation of any silicon die produces heat as a side effect. Since heat may damage or even destroy a semiconductor die, many dies include a thermal sensor which allows for determining the current temperature of a die. Depending on the temperature, die operation may be controlled in a way that prevents damaging temperatures. In a simple implementation, use of the complete device is prevented if one of its parts is overheating. In other implementations, usage of an overheating part may be throttled, increasing response time of the element but otherwise continuing operation of the device. An example is to speed up the refresh cycle of DRAM (Dynamic Random Access Memory) memory elements, which is necessary for data retention at higher temperatures but also decreases throughput of the device.

There are several issues in both single die and stacked die environments which are not considered in known solutions. One temperature sensor on a die may not be sufficient for an effective control. The temperature on a die may vary between different areas of the die. This may be due to a more extensive usage of certain areas, such as more frequently used memory banks and rows, but also due to constructional features. A single temperature sensor on a die, as often used, may therefore not give sufficient information on the actual heat source. Even worse, a single sensor which is located at some distance from the heated spot will discover overheating later than actually occurred, which means that safety margins have to be added to the temperature thresholds for the sensor.

Especially in a stacked or three-dimensional structure, where a die may be sandwiched in between further dies, heat conduction of the substrate materials may lead to heating of adjacent dies. That is, not only the actual heat source will show a higher temperature, but also dies below or above may give higher temperature readings. Since the reaction to increased temperatures is usually a deactivation or throttling of die usage as described above, this may lead to a decreased performance of several dies or die areas which are not the real source of overheating. Another reason to determine the heat source as exact as possible is that large temperature differences within a die stack should be avoided. Excessive temperature differences may warp the die stack and as a consequence cause fatigue and potential material failures.

Nevertheless, the current approach for thermal sensors cannot simply be extended to multiple sensors, which may help to determine an exact location of a heat source. The logic required for multiple sensing on a die would be significant. A larger number of analog to digital converters (ADCs) and possibly other control logic would be necessary, which would lead to increased cost. Similarly, multiple sensors would linearly increase the required number of connection pins.

SUMMARY

According to exemplary embodiments of the invention, a method is provided which may in exemplary embodiments comprise obtaining temperature values from at least two thermal sensors arranged on resources within a three-dimensional die structure; determining at least a partial three-dimensional temperature distribution for said die structure; and controlling activity of said resources of said dies in response to said three-dimensional temperature distribution.

In some embodiments, the determining may include comparing temperature values of said at least two thermal sensors with each other; locating at least one heat source based on said comparing; identifying at least one resource associated with said at least one heat source; and the controlling of activity may include throttling activity at least in said at least one identified resource.

According to an embodiment, the activity may be throttled if said at least one temperature value associated with said at least one identified resources is above a predefined threshold.

The identifying may for example include identifying a resource associated with the highest of said compared temperature values.

Additionally, in some examples the method may comprise receiving a signal indicating a temperature value above a second predefined threshold. In some further embodiments, the method may further comprise sensing said temperature values in response to said received signal.

In exemplary embodiments, the method may include continuously sensing said temperature values.

Also, a method may in certain embodiments further comprise selecting a specific sensor to be sensed. The selecting may in some embodiments further comprise providing a control sequence signal for switching elements connected to said sensor. In exemplary embodiments, the switching elements may be multiplexers.

According to exemplary embodiments, a method may further comprise selecting a specific sensor for evaluation; wherein said obtained temperature values include a selected temperature value sensed by said selected sensor; and wherein said comparing comprises comparing said selected temperature value to at least a further one of said obtained temperature values; and issuing a throttle order for a resource associated with said selected sensor if said selected temperature value is determined to be the highest value in said comparing.

In some embodiments, the method may comprise issuing a throttle request for a defined further resource if a temperature value associated with said further resource is higher than said selected temperature value. It may in these or other embodiments comprise checking whether a throttle request exists for a selected resource.

According to exemplary embodiments, the method may further comprise comparing a selected temperature value associated with said selected resource to a second temperature value associated with the resource which has issued said throttle request; and issuing a throttle order for said selected resource if said selected temperature value is higher than said second temperature value.

The throttling may according to exemplary embodiments be triggered by a binary throttle order associated with a specific resource.

In some embodiments, the method may further comprise determining a measure of confidence that at least a selected resource needs to be throttled. Such a measure of confidence may for example be included in a throttle order and/or a throttle request.

In exemplary embodiments, said throttle request is a binary value associated with a requesting resource.

The comparing and/or said throttling may in specific embodiments be based on information on relative sensor locations within said die structure.

In some embodiments, the at least two temperature values are obtained from adjacent sensors within said die structure, for example from neighboring sensors on the same die or from sensors located above and/or below. However, also non-adjacent sensors may be measured and/or compared.

According to a further aspect of the invention, a computer program product is provided which may in exemplary embodiments include computer program code which, when executed, causes a device to execute a method according to any of the above described embodiments.

According to a further aspect of the invention, a device is provided comprising at least two semiconductor dies packaged together in a three-dimensional die structure; at least one thermal sensor located on each of said dies; a control unit connected to and controlling said thermal sensors; wherein said control unit is adapted to obtain temperature values sensed by said thermal sensors; determine at least a partial three-dimensional temperature distribution for said die structure; and issue throttle orders for resources on said dies in dependence of said temperature distribution.

In exemplary embodiments, said control unit is further adapted to sense a selected thermal sensor.

According to exemplary embodiments, said control unit is adapted to continuously evaluate at least a part of said thermal sensors, said evaluation including said determining of a temperature distribution and said issuing of throttle orders.

The device may in some embodiments further comprise a memory element configured for storing said throttle orders, and/or a memory element configured for storing said temperature values and/or said temperature distribution. The memory elements may in some embodiments also be the same element.

In exemplary embodiments, the device may further comprise switching elements coupled between said control unit and said thermal sensors, said switching elements being configured for selecting a specific thermal sensor. These switching elements may for example be multiplexers. Switching elements may in exemplary embodiments be arranged such that only a single sensor at a time is connected to said control unit.

According to some embodiments, said device may further include a sensing unit. The sensing unit may in exemplary embodiments comprise an analog-to-digital converter.

In exemplary embodiments of the device, said thermal sensor may be a thermal diode.

In some embodiments, said sensing unit is coupled to a compensation unit configured for modifying values sensed by said sensing unit. Also, in these or other embodiments, said sensing unit and/or said compensation unit may be coupled to a comparator configured for comparing values sensed by said sensing unit.

According to exemplary embodiments wherein said control unit includes at least one of said sensing unit, said compensation unit and said comparator. Said control unit may in some embodiments be implemented via software code.

DETAILED DESCRIPTION OF EXEMPLARY EMBODIMENTS

Figure 1:
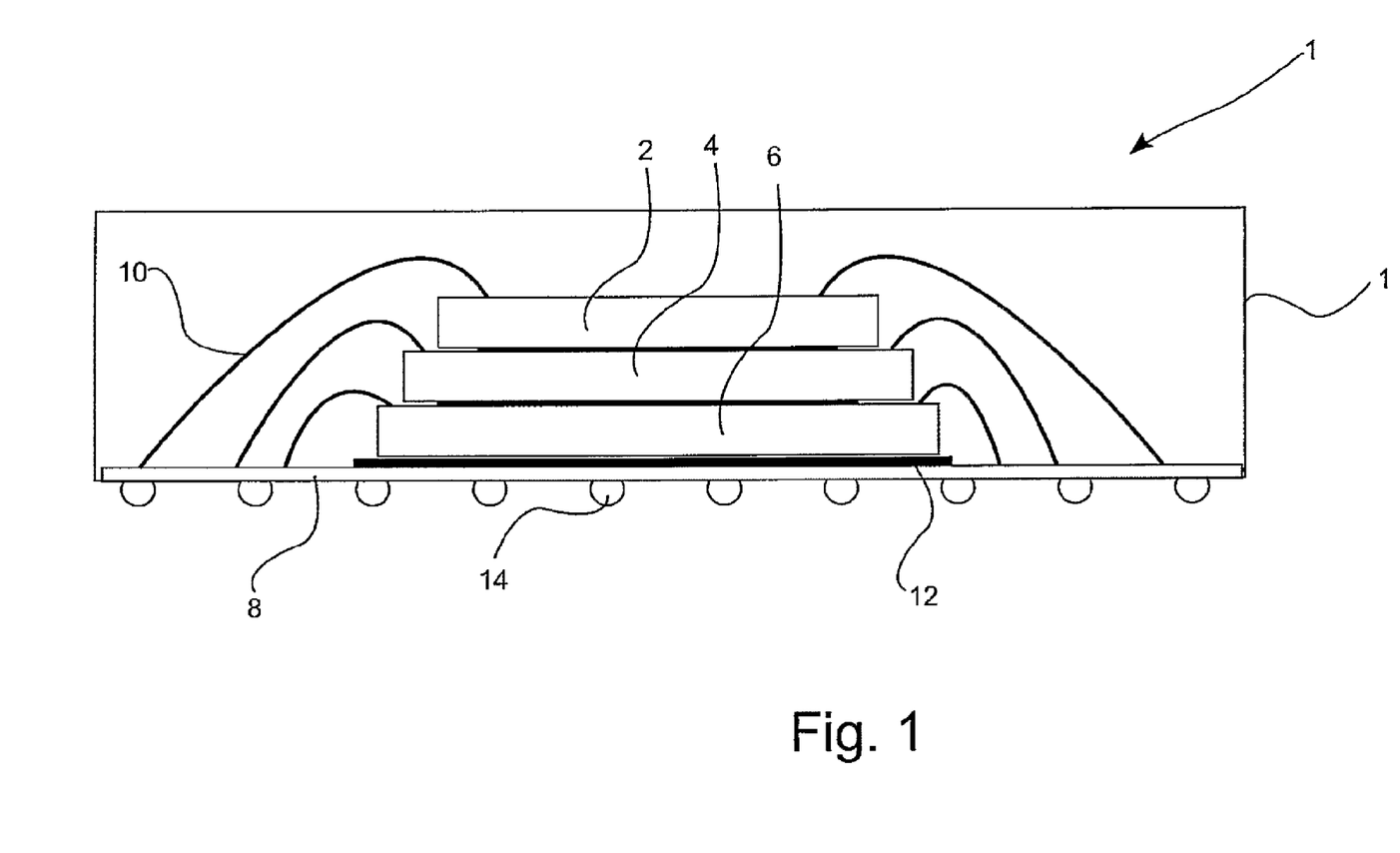
FIG. 1 depicts a stacked die system with three dies.

FIG. 1 shows a cross section of a system 1 of stacked semiconductor dies forming a so-called die stack or 3D-IC in a single package. The three dies 2, 4, 6 are stacked vertically on top of each other and may be connected by an adhesive, a connecting pad 12 or similar attaching means. All dies are arranged on a substrate 8 which is also used for outside connections. Interconnections may be provided by wired connections 10 along the edges of each die 2, 4, 6 leading to the substrate 8. In other embodiments through vias within the dies may provide for connections from die to substrate or between dies. For heat dissipation, thermal vias may be provided as well. In some embodiments, dies may be connected in a flip-chip technique using conductive bumps placed between the connecting surfaces of two dies facing each other. Besides the stacked dies, further dies arranged horizontally may be present within a single package. Also, die sizes do not have to match, such that two smaller dies may e.g. be placed on a single larger one. A package 16 is provided around the bare dies for protection from external influences, e.g. made from plastic or ceramic materials. Solder bumps 14 on the bottom of the substrate are used in this example to provide connection interfaces for integrating the complete chip 1 into a circuit. It shall be noted that many variants of stacked die systems are conceivable and known in the art, and that details of those or the functions of each die or element are not relevant for the present inventive idea.

Figure 2:
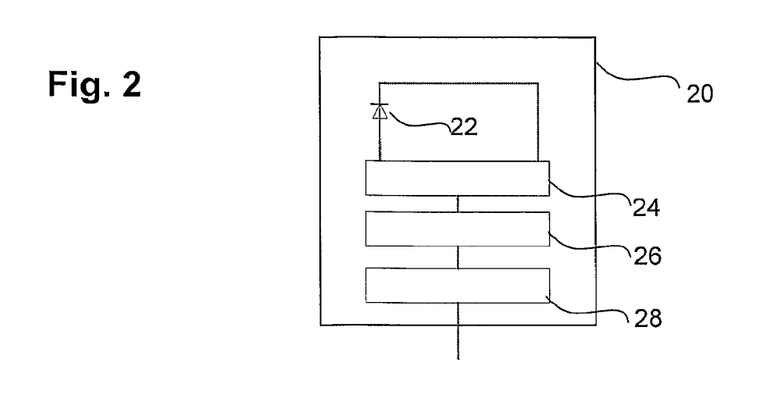
FIG. 2 is an illustration of a prior art thermal sensing system on a die.

FIG. 2 is an illustration of a prior art thermal sensing system on a die 20. Typically, thermal sensors 22 generate an electric signal which is a function of the temperature of the sensor element, e.g. an output voltage or current may be proportional to the current temperature. The electric signal may be relayed and processed further as desired. The sensor may be any temperature sensitive device, such as a p-n junction device like a diode or a transistor, or a temperature sensitive resistor. In the embodiments described, the sensors are thermal diodes 22. However, it should be understood that diodes are only used by way of example and that other sensor types may be employed. The diode 22 is coupled with both terminals to an analog-to-digital converter ADC 24 which converts the analog diode signals into digital values. In the comparator 26 connected after the ADC, it is examined whether the determined temperature value exceeds predefined threshold values. The successive interrupt logic 28 may, in dependence of the output of the comparator 26, decide to generate an interrupt signal if necessary. All these elements are located on the die 20 itself.

Figure 3:
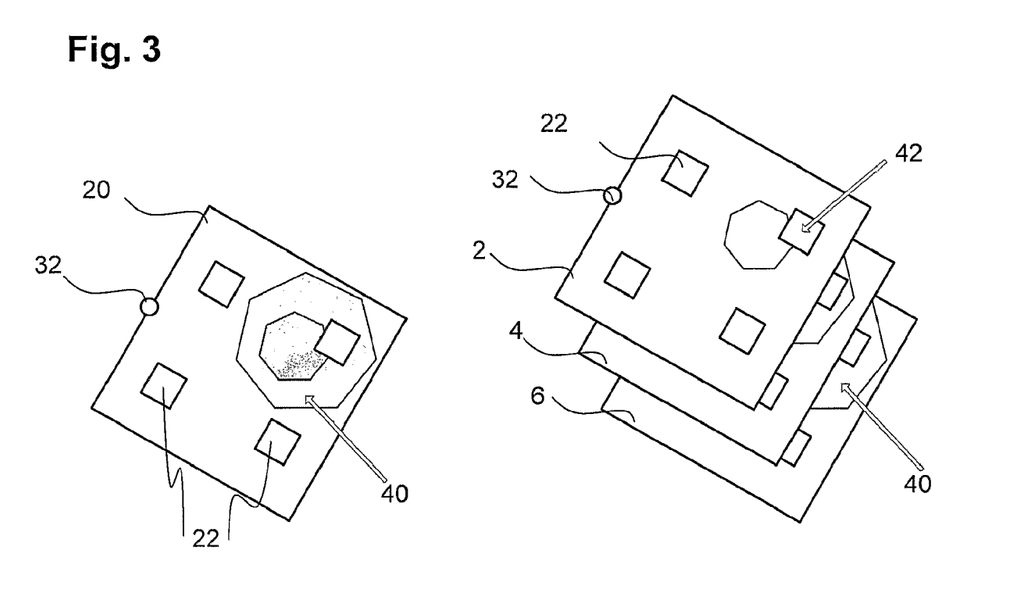
FIG. 3 shows the difference in heat generation on a single die and a 3D system.

FIG. 3 shows the difference in heat generation within two-dimensional and three-dimensional systems. On the left in FIG. 3a, a single die with four sensors 22 is shown. The sensors are arranged in a regular manner in this example, but in other embodiments sensors might also be arranged on different locations. The shaded areas 40 indicate a temperature gradient which may be generated by a heat source in the middle of the marked area. It is assumed that the temperature is above a preset threshold at the upper right sensor, and below the threshold at the remaining sensors. This allows to confine the location of the heat source 40 to one quarter of the die area. FIG. 3b on the right shows a system of three stacked dies 2, 4, and 6. The displacement is for illustrative purposes only, and in an actual system the dies may be contacting. In this example, the sensors 22 on each die are arranged as those of the single die example, i.e. one sensor for each quarter die area. The primary heat source 40 is assumed to be in the lowest die 6. Therefore, the respective sensor in the lowest die 6 will give a temperature reading above the threshold and may create an interrupt signal as described above via the interrupt 32. However, due to the direct contact and good heat transport between the dies 2, 4, 6, areas on the upper two dies 2 and 4 will also be heated to some extent. While the heating may be less than on the die 6 which is the heat source, it may still cause a temperature increase beyond a predefined temperature threshold, such that the sensors of the upper dies also indicate overheating. Not only directly neighboring dies may show elevated temperature levels, but depending on the heat transport characteristics of the materials used also dies which are located farther away in the stack may be affected.

Thus, it is necessary to determine a three-dimensional view of the temperature readings on the stack in order to find the true heat source and react accordingly. Deactivation or throttling of functions of the upper dies would unnecessarily degrade performance of the integrated circuit without lowering the temperature below the threshold. Only the die or part of a die which is responsible for the overheating needs to be throttled or controlled. With several sensors on each die and a combined control and evaluation for at least some of the temperature sensors of different dies, it is possible to get a three-dimensional temperature map instead of only single die temperature information. From this temperature map and the corresponding temperature gradients, it is possible to derive an actual heat source within a three-dimensional die structure. In the evaluation of the temperature data, other information such as material characteristics, functional die areas and structural features may also enter the final assessment. The thermal sensors employed may be different for different dies, or even on a single die, as long as the common control element allows to interpret and combine their readings correctly.

Figure 4:
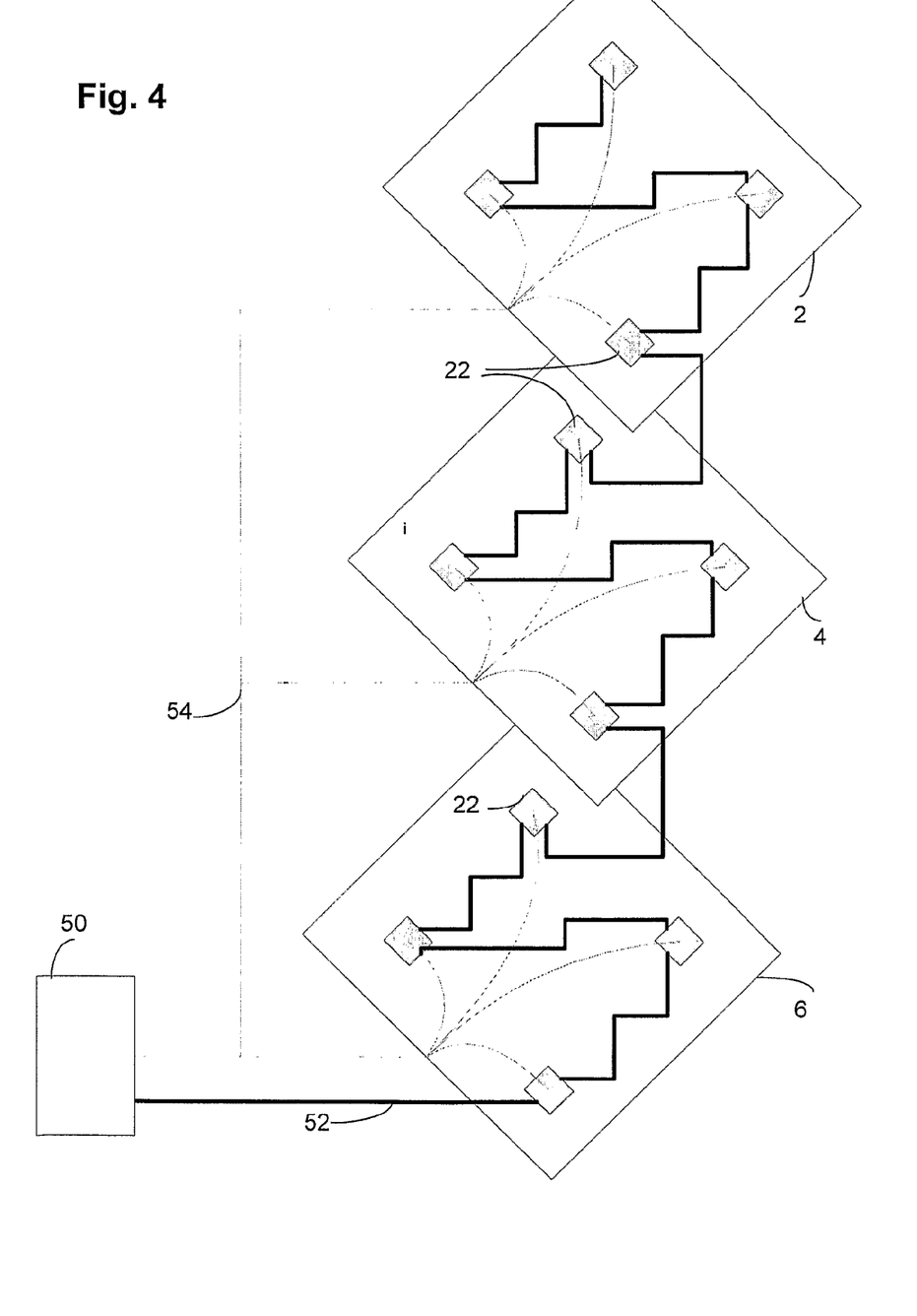
FIG. 4 schematically illustrates a possible embodiment for controlling and sensing individual sensors on three stacked dies.

FIG. 4 illustrates, by way of example, an inventive concept of controlling and sensing individual thermal sensors 22 on three stacked dies 2, 4, and 6. In the figure, the dies are once more shown displaced for the sake of clarity, but it will be understood that these dies may be located directly on top of each other in an implementation. Each die contains four thermal sensors 22 shown as small squares. In other embodiments, more or less sensors may be used, and they might also be arranged in a different pattern than the one used here. A common control unit 50 contains the analysis and control logic for the thermal sensors 22 on all dies. While a single control unit or entity is shown here, further control entities may be utilized in case of extensive setups with a large number of sensors to be controlled. The control cycles through all the sensors, activating only one at a time. It can be seen that the sensors of all dies are connected in series by a control line 52 for this purpose. The connection sequence may be chosen such that the connecting paths are minimized, or in another suitable way. In the example of FIG. 4, all sensors of one single die are coupled in series, and from the last sensor on a die a connection to the first sensor of another die is made. The sensed values are returned to the control entity 50 using a shared signaling resource 54.

Figure 5:
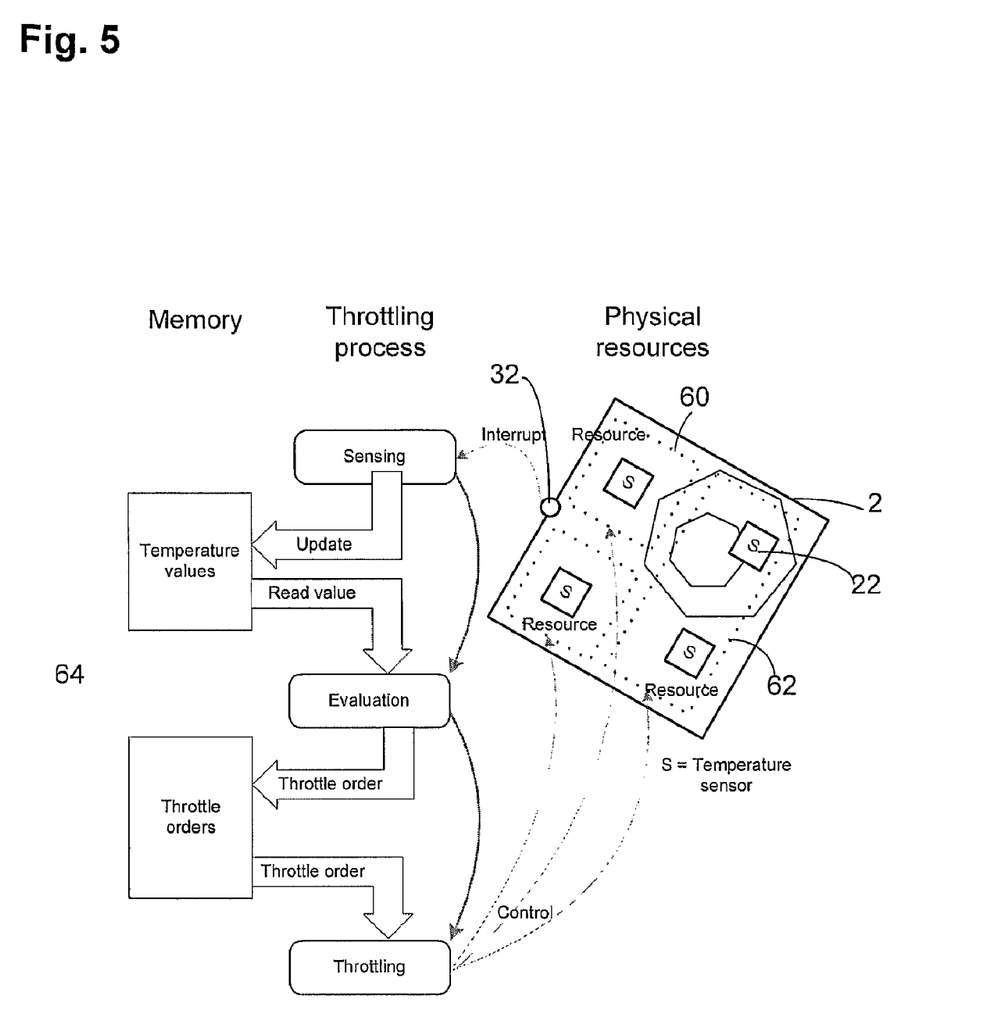
FIG. 5 is a diagram of an exemplary embodiment of an inventive temperature control system.

FIG. 5 is a diagram of an exemplary embodiment of an inventive temperature control system. The system may be structured into three levels or parts. One part is the physical resources, such as the processors, memories, accelerators, or buses which may be formed by or within the semiconductor dies 2. Several resources 60, 62 may be provided on a single die. These are the components producing heat and generally, a higher activity in those resources will lead to increased heat generation of the corresponding die areas. For the same reason, throttling of the activity of a resource may help to decrease the temperature. In the example shown, three different, arbitrary resources are shown on the die 2. It will be understood that, while only a single die 2 is shown here, the setup for the further dies of a stacked configuration may be similar, for example like the one of FIG. 4.

The second part is the throttling process and the corresponding memory transactions. Sensing of the thermal sensors is triggered by an interrupt 32 that indicates a significant temperature change at one or more sensors 22. The specific sensor may also be indicated. In response, a sensing process is initiated where the relevant sensors are read and the temperature values are written to a memory. Subsequently, an evaluation process compares the determined temperature values against predefined threshold values. Based on this comparison, it is decided whether throttling or another cooling activity is required. The decision on any cooling, throttling or restriction may also be stored in memory. Finally, a throttling process is started based on the decisions for throttling stored in the memory. Here, it is determined which commands shall be given and which resources need to be restricted.

The third part of the system is a memory 64 (or register) which may contain the status information for the throttling process. Both the temperature values read from various sensors and the necessary actions for throttling the relevant resources may be stored for further processing. The memory elements used may be different elements for each application or the same element.

Implementation of such a temperature controlling system may be done in different ways. An algorithm may be used to evaluate the obtained three-dimensional temperature information and to decide on throttling measures when necessary. An example of an algorithm is given in appendix A attached to this description. The exemplary algorithm is shown in a pseudocode, i.e. in an exemplary structural description which shall not limit the actual algorithm when implemented in a device or software code. It is merely intended to show key points of an exemplary embodiment of an inventive method without any necessary relation to real-world programming languages, software code structures or other implementation details. An exemplary method flow diagram is given in FIG. 6.

Figure 6:
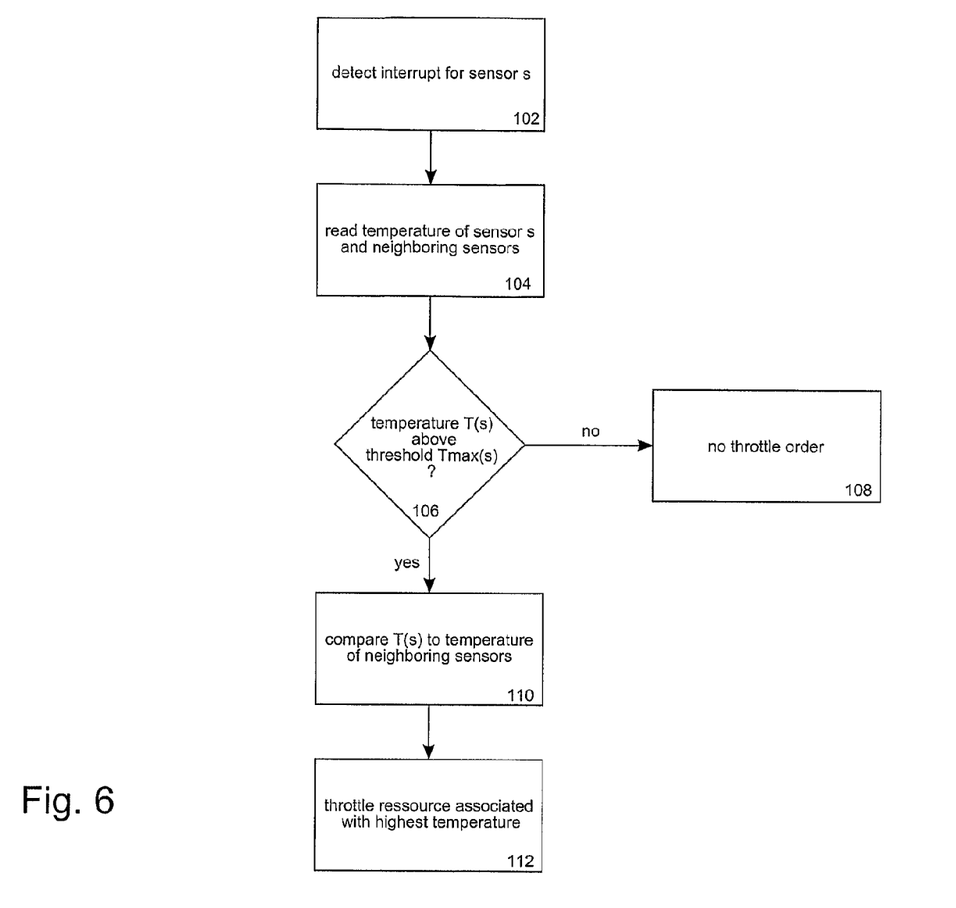
FIG. 6 shows a flow diagram for an exemplary embodiment of a temperature control method.

A throttling process in a stacked die system is entered through an interrupt and sequentially invokes a sensing function, an evaluation function, and a throttling function. In the sensing process, the temperature of the sensor that generated the interrupt is read. The present example may include additional readings of sensors above and below that sensor. If the measured temperature of the triggering sensor is higher than that of the above and below sensors, a throttling of the corresponding resource may be ordered.

In more detail, memory space may be reserved for each sensor plus one additional position. Also, threshold temperature values for each sensor and one additional value may be stored in a memory. A simple implementation is to use binary throttle orders, i.e. a resource associated with a specific sensor is either throttled or not, which may be indicated by a binary variable for each sensor. The additional sensor element defined in the values above may be used to provide an error code, e.g. for wrongly indicated sensors.

The pseudocode in appendix A defines an exemplary evaluation loop which is invoked by an interrupt. Threshold values may be updated outside this evaluation loop, and these may e.g. be entered by a user via a suitable application or preset in the system without any possibility for changing the values. All sensors in the system may be associated with an identifier, such as integers from 1 to n, n being the total number of sensors controlled by this system. There may be some information stored about the spatial arrangement of sensors, such that functions above_sensor(x) and below_sensor(x) may be defined which return the respective identifier above or below the sensor indicated by x.

The evaluation loop is then passed as shown in the pseudocode example A or also in FIG. 6, showing a corresponding method flow diagram for the exemplary embodiment. The interrupt indicates that a certain sensor exceeded a predefined temperature threshold in step 102. This may trigger the sensing and throttling functions according to the example implementation. First, the temperature of the sensor in question which is indicated by the interrupt signal is measured in step 104, or, if temperatures are sensed and stored outside this loop, read from a memory. In addition, temperature values of a sensor above and a sensor below this sensor are measured in the same step, as indicated by lines 25 and 26 of the pseudocode. Evaluation of the measured values is implemented in this example by a conditional procedure. In a first step 106, it is checked whether the temperature T(s) of the selected sensor is above a predefined and stored threshold $T_{max}(s)$ (indicated as "threshold[s]" in the pseudocode example). If this is the case, it is further compared in step 110 whether the relevant sensor s has the highest temperature out of the three measured sensor values, or whether one of the sensors above or below (i.e. on the adjacent dies within the stack) has a higher temperature reading than the middle one. In response to this comparison, a throttle order is given for the resource determined to have the highest temperature value in step 112. The correct resource is indicated by an identifier corresponding in some way to the sensors. A throttle order in a simple way may be defined by a binary value, i.e. it may be defined that a value of 1 for a certain sensor s is interpreted as a command to throttle the corresponding resource, while a value of 0 indicates that throttling of the corresponding resource is not required. It will be understood that an algorithm for evaluating sensor readings may also be implemented in a different way while still using comparisons between three sensor values of sensors located above each other.

There may be additional prescriptions and definitions in the algorithm, e.g. for the case that more than one sensor exceeds its temperature threshold. Also, an embodiment may include not only comparing the actual temperatures, but also taking into account that the allowable and expected temperature range may vary for different die resources, e.g. due to different die materials. This may be implemented by adding or subtracting a predefined temperature value in the comparison of measured temperatures, such that a sensor may be throttled although it does not show the highest temperature in absolute numbers. In other examples, not only the sensors below and above the "triggering" sensor may be considered, but also further layers farther below or above the respective die layer. It is conceivable to make further sensor measurements dependent on a first result from a temperature evaluation, such as a case where a lower sensor shows the highest temperature reading, which may trigger temperature sensing for the next lower die level.

The method as described above may be modified in numerous ways. As an example, not only binary throttling orders may be used. In some embodiments, several threshold values may be defined for the evaluation and/or throttling functions, such that one of a number of throttling procedures is chosen dependent on the level of overheating. A multi-level throttling system may be implemented by indicating the actual measured temperature in the throttling order, such that the throttling function determines the action to take. In other embodiments, the classification of measured temperatures into levels of overheating may be performed at the evaluation stage, such that throttling orders with e.g. integer values between 0 and 3 (or other values) are issued based on the sensed temperature or certain temperature differences between sensors. Then, the throttling function provides the required throttling action based on these values. As an example, a resource may only be throttled to a lower level of activity up to a certain temperature reading, and a complete deactivation of the resource may be order for very high temperature values.

Other embodiments may include considering other or further sensors. Since heat may also propagate within a die and not only between stacked dies, it is conceivable to incorporate sensor readings from those sensors which are close to the triggering sensor on the same die. The algorithm might then be implemented similarly to the example above, i.e. by subsequent comparisons of the sensor reading which triggered the evaluation with those of neighboring sensors. In more complex embodiments, any number or combination of sensors may be considered in evaluation, and even the complete set of sensors within a die system may be used for deciding on cooling measures based on the three-dimensional temperature map.

It may also be possible to define some absolute thresholds for sensor readings which may lead to throttling of the resource independent of a comparison result. That is, even if a neighboring sensor shows higher temperature value, such an additional throttling threshold may order throttling of this resource as well, instead of only the resource associated with the highest temperature reading. This may help to prevent overheating in cases where the actual heat source is not unambiguously determinable, since a resource may show very high temperatures when the respective die area is heated by activities of both this resource and a neighboring resource. These thresholds may be similar or different from those defined for the initial interrupt.

Figure 7:
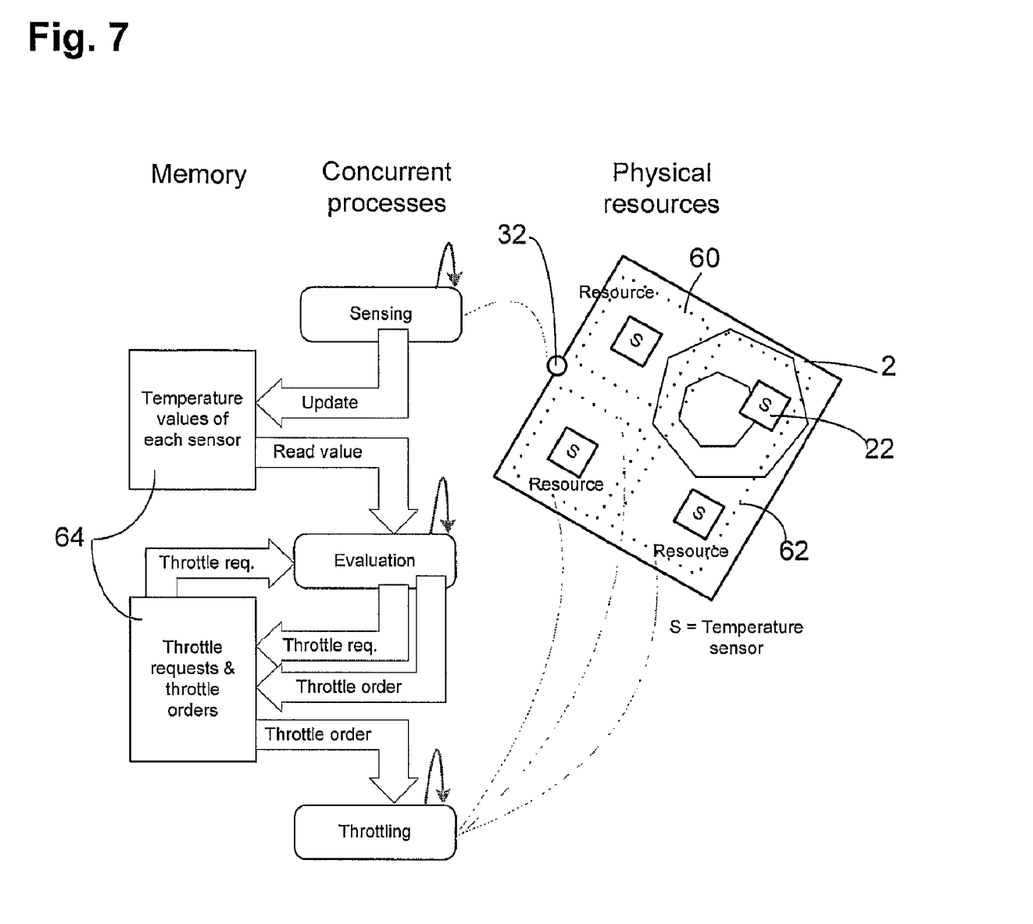
FIG. 7 is a diagram of another embodiment of an inventive temperature control system using concurrent processes.

Any of the previously described processes may also be concurrent. Running of the processes in parallel may decouple the speed at which the individual processes need to be run. In addition, the operation principle may be changed from interrupt-drive as described above to a continuous operation. An example of such an embodiment is shown in FIG. 7. The physical resources in the right column are the same as those described for FIG. 5. In the present example, the concurrent processes shown in the middle are three parallel processes and their memory transactions. It shall be noted that the sensing, evaluation and throttling processes have been sequential processes in the example of FIG. 5. Here in FIG. 7, the sensing process continuously loops through the various sensors on the dies and writes the returned temperature values in memory. Similarly, the evaluation process continuously loops through the temperature values stored in memory and decides on this basis whether throttling or other cooling activity is necessary. As before, the throttling orders or decisions may be stored in memory. Finally, the throttling process continuously loops through the throttling decisions as read from the memory and controls resource throttling in response to the retrieved orders. All loops as described are indicated by the small arrows leading back to the process itself.

The left part of FIG. 7 again contains the status information of this system control. These memory spaces 64 may be shared between processes, but just one process may write to each memory location, such that there are no race conditions or conflicts.

Figure 8:
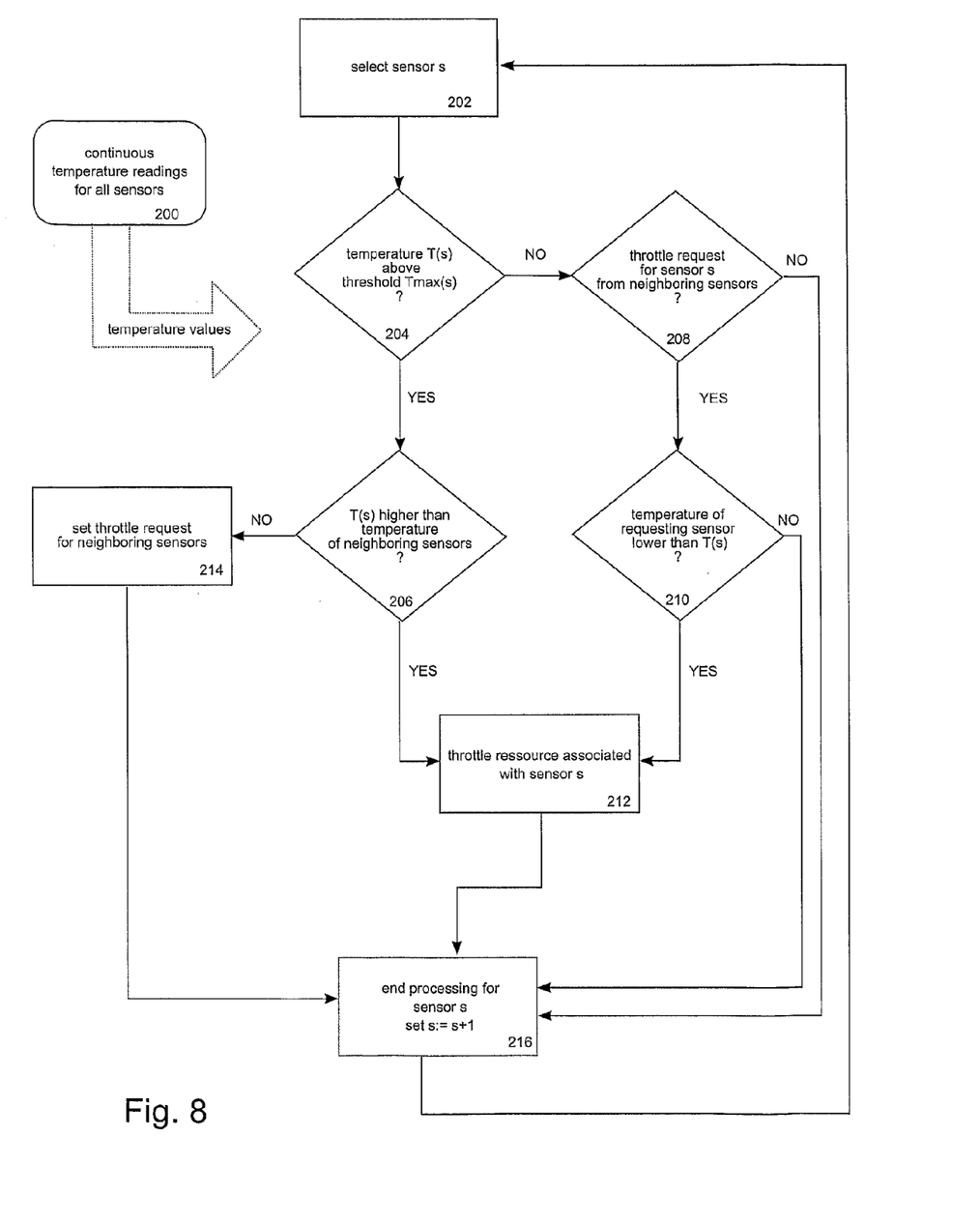
FIG. 8 shows a flow diagram for another exemplary embodiment of a temperature control method.

An exemplary algorithm for an embodiment such as that of FIG. 7 is given in Appendix B. A flow diagram for this example is shown in FIG. 8. If the measured temperature of a sensor is higher than a predetermined threshold value and this resource is hotter than the surrounding resources, this particular resource is throttled. If the surrounding resources show higher temperature readings, a request is made to throttle them. If the threshold value is not exceeded by a sensor reading, but there is a request from a surrounding resource to throttle this resource, and the resource is hotter than the surrounding resources, the resource may still be throttled. In other cases, there is no need to throttle this resource.

More particularly, memory may again be allocated for temperature sensor readings and thresholds, similar to the example of FIG. 5 and Appendix A. Additional memory or variables may be required for storing throttling requests directed to other sensors (line 62 in appendix B) than the one currently evaluated.

Different from the first example algorithm, the loop is not triggered by an interrupt but is continuously looping, thus integrating the temperature threshold monitoring into the loop by a check. Temperature values are read from the sensors continuously (step 200) and may be stored, buffered or directly transferred for use in the control loop. In each cycle, each controlled sensor is evaluated. If a temperature above a preset threshold is detected for a specific sensor in step 204 which has been selected for evaluation in step 202, an inner loop (lines 80 to 87) is started which compares the temperature of the currently processed sensor to that of neighboring sensors (step 206). In the example, the sensors below and above are used again for comparing by applying predefined functions like above_sensor and below_sensor, but other or more sensors in the system may be used in further embodiments. The sensors which are chosen for temperature evaluation may be predefined or might also be updated when required.

Again, a binary throttle order is issued if the processed sensor or rather the corresponding resource has a higher temperature compared with predefined neighboring sensors (step 212). If this processed sensor is not the one having the highest temperature, the algorithm loop continues by setting a throttle_request to a value of 1 in step 214, which may indicate that at least one of the resources surrounding the sensor s needs to be throttled. The resources which are covered by such a request may be defined as required, e.g. the request may only extend to the resources above or below the current sensor, or to all sensors located on the same die. Possible uses of the throttle request variable will be discussed below.

For the case that the processed sensor does not show a temperature above its threshold in step 204, the outer loop continues as follows (line 88). It may be checked whether there are throttle requests for the current sensor which have been issued by neighboring sensors in step 208. If a neighboring sensor has issued a throttle request, i.e. this neighboring sensor has determined that one of its own neighboring resources (including the resource in question) should be throttled, and the temperature measured by that sensor is lower than the temperature of the processed sensor as determined in step 210, the currently processed sensor is again throttled (step 212). A throttle request by a neighboring sensor which does not involve a relatively higher temperature at a sensor compared to that neighboring sensor will not induce a throttling order and end the procedure for this sensor (step 216). Similarly as for other embodiments, the throttle request may alternatively indicate the confidence that the surrounding resources need to be throttled as a numerical value instead of a binary request flag.

Various combinations and enhancements of the above exemplary embodiments are possible. Also, they may be modified in different ways. For example, further actions may be taken in response to certain temperature readings. Warnings may be issued to a user, or memory allocations may be moved from overheated memory resources to another resource in order to protect data and prevent a break down of functionality. The respective actions may be triggered by additional orders and/or requests included in an algorithm. There may also be different thresholds for cooling measures and further actions. In case of an interrupt triggered evaluation process, it may be implemented that not only the triggering sensor is processed but also other sensors. Furthermore, several sensing cycles instead of a single one may be induced by an interrupt to produce reliable temperature readings, and/or to obtain a number of temperature values as a function of time which may be used as additional information for evaluation.

In order to read separate sensors in a die system as desired, e.g. for an interrupt triggered or continuous temperature sensing, a suitable hardware implementation is required. It is assumed that in the described example at least several sensors 22 located on one or more dies 2, 4, 6 are controlled by a single control unit or control entity. This entity may analyze, control and evaluate all temperature related issues in a die system, or only a part of it. The control system may be implemented as described above on a logical level. For reading the sensor values, the control may cycle through all the sensors activating only one at a time. The sensor value may then be sensed or read back using a shared signaling resource (cf. FIG. 4).

The evaluation and throttling sequences as described by way of example above require selecting a specific sensor from the three-dimensional sensor arrangement in a die stack. There are several possibilities for achieving this effect. One option is to control the galvanic connection to the sensor by multiplexing. An implementation may include a single multiplexer on each die for all sensors arranged thereon, or several smaller multiplexers on each die. In other embodiments, other switching elements may be used. For example, a specific sensor may be selected by digital logic such as using control registers which are writeable from outside the die. The registers may act as switch control inputs, while the corresponding switches control a connection to a voltage or current source associated with the temperature sensors.

A first option for programming the sensor selection is to use programmable control registers that control which of the sensors is active. The information in the registers may be implemented in a one-hot, binary, or Gray encoding. One-hot refers to a group of bits where the only allowable combinations are those with a single bit set on high or 1, and all other bits on low or zero. Gray encoding usually refers to a modified binary encoding where two successive values differ in only one bit. All these and further register implementations which may be used in relation to inventive embodiments are known in the art and will not be explained here in more detail. Writing and possibly reading of such registers in a control system may be achieved through the normal data interface of a die.

Another option would be an interface containing a single data signal line and a single clock. These two signals may be referred to as a combined control signal in the following. The exemplary control line shown in FIG. 4 may also be formed by these signals. The data signal line may consist of D flip-flops such that each time a new data value is clocked in from the beginning of the data path, each of the flip-flops gets the value of the previous flip-flop as its new value. The values of the flip-flop outputs may be used as sensor selection controls.

Figure 9:
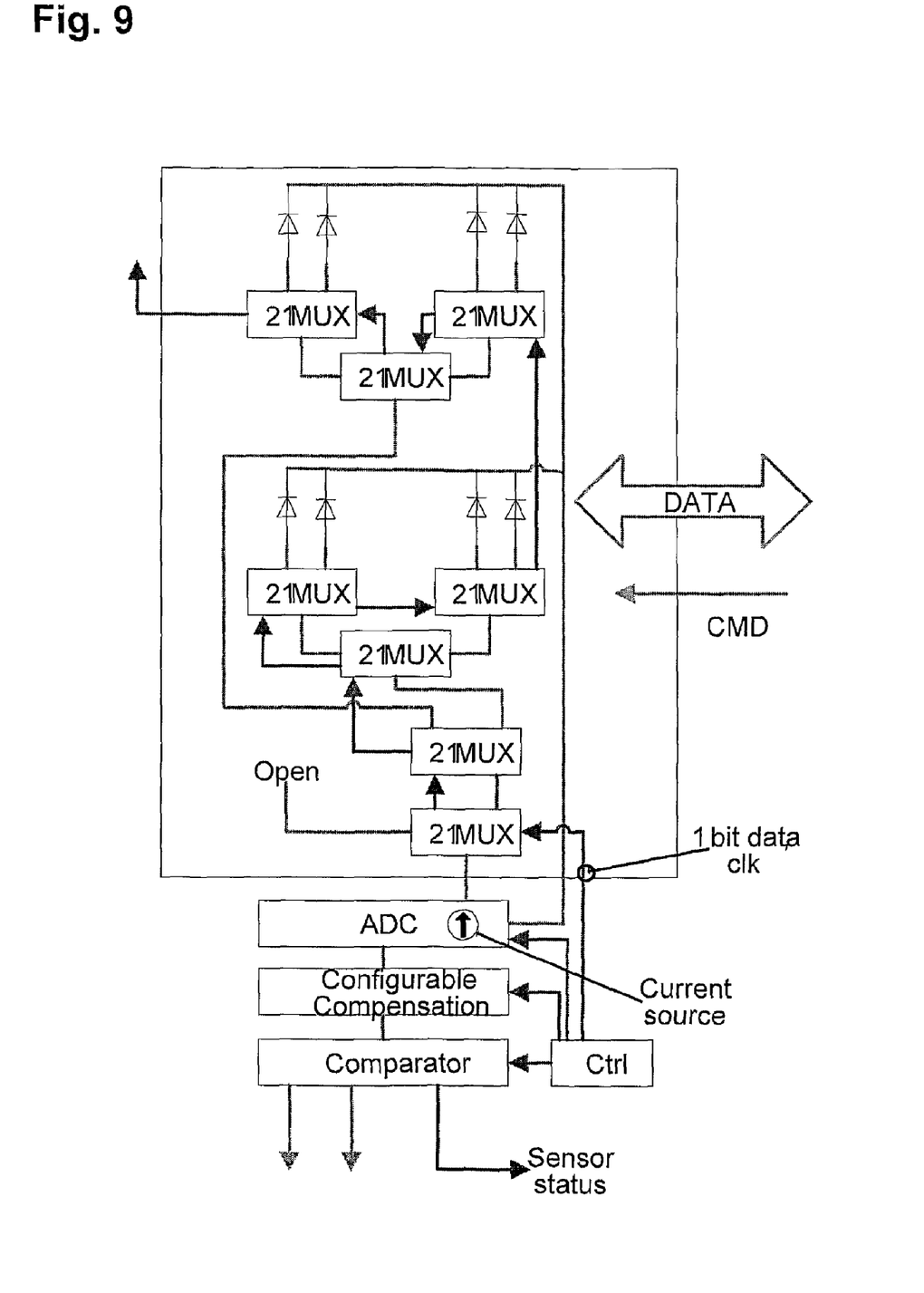
FIG. 9 is one die in an embodiment of a sensor sequencing scheme for several sensors in a multi-die system.

FIG. 9 illustrates a part of an exemplary inventive embodiment for selecting a specific sensor to be sensed. While only one die is shown schematically, it will be understood that the system may include several dies controlled by the same control entity. A daisy-chained 1-bit data bus and a clock signal are used to toggle configuration data in the chain, indicated by arrows. Multiplexers are used for controlling the galvanic connections of several thermal sensors on the die. The multiplexers are also located on the die itself. In the example shown, thermal diodes are used as sensors, and the multiplexers are 2-to-1 transmission gate multiplexers, but other switching methods are equally conceivable. The multiplexers allow for a galvanic connection of an analog sensing module such as an analog-to-digital converter ADC to a selected sensor. This ADC is not located on the die, but is external to the die and may be combined with the further elements in a control entity. Further elements are a configurable compensation block connected to the ADC that is used to compensate for offsets and/or non-linear behaviour of individual sensors. The compensation block is further connected to a comparator which facilitates comparison of measurement values which have been received through the ADC and the compensation block. All of these external sensing and evaluation elements may be combined outside the die and may be controlled by a control block. The control block may be combined with the compensation block, the comparator and the ADC in one entity, which may optionally also have further functionality. In some embodiments, comparator, control and compensation may be implemented via software code for added flexibility.

The first multiplexer shown on the bottom of the die in FIG. 9 may implement a "chip enable" functionality. An input signal from the external control block is provided to this multiplexer. As described before, this signal may include a single data line and a clock line.

If this signal from control to first multiplexer is not enabled, none of the sensors on this die will be active regardless of their control bits. The control signal (depicted as arrows) is then conveyed through the chain of multiplexers, giving signals which decide on the status of each multiplexer. Parallel to the control line, the electrical connections are shown between the multiplexers and to the thermal sensors as lines without arrows. In the present example, eight sensors are located on the die, and seven multiplexers are required for allowing to select a single one of these sensors. When more or less sensors are present on a die, the number of multiplexers used will also be different. From the last multiplexer on the die, the control signal continues to the sensor circuits on the next die within the system that is controlled by the same control entity. These further dies and their connections to the comparator, ADC and compensator are not shown in the figure. It will be understood that the control entity including the external sensing, evaluation and control elements may control any number of sensors on several dies.

Figure 10:
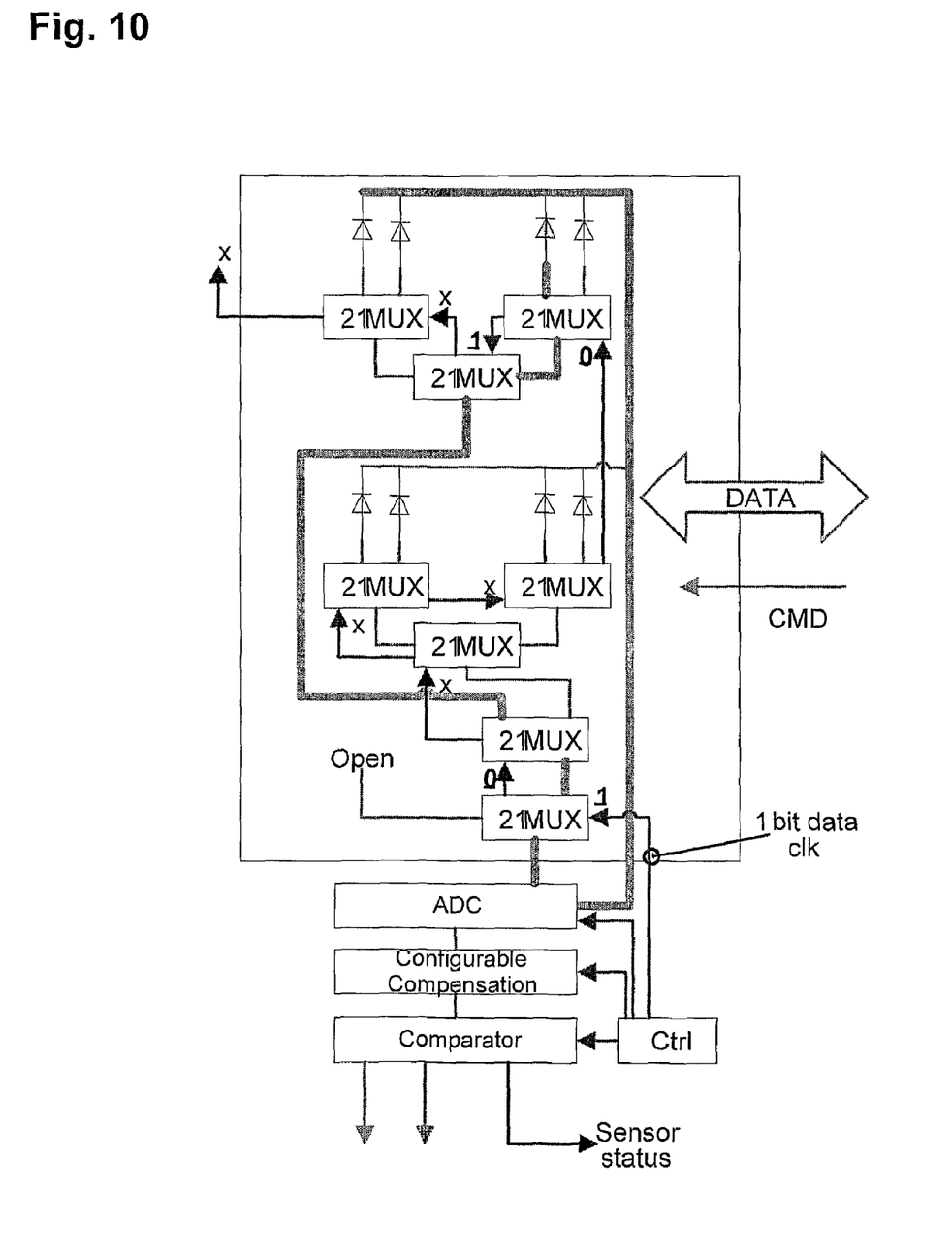
FIG. 10 is an illustration of sensor selection based on the embodiment of FIG. 8.

FIG. 10 illustrates an example of controlling the multiplexers in the embodiment of FIG. 9. The hardware setup shown is the same as described above for FIG. 9. A single sensor, in this example the marked sensor on the upper right, shall be accessed for a temperature reading. The required electrical connection may be provided by the line connected between one sensor terminal and the ADC on one hand, and the electrical line routed through the chain of multiplexers and connected to the second sensor terminal on the other hand. These electrical connections are indicated as bold lines in FIG. 10. Again, the control lines are depicted with arrows. Additionally, the input given by the control signal is shown next to each multiplexer input. In this example, an input control value of '0' always selects the left signal path, and correspondingly a value of '1' will select the path on the right. A value indicated as 'x' means a "don't care" value, which is, the value may be either 0 or 1 without changing the result.

Reading the selected sensor is accomplished as follows. A program is fed in via the control block. For each sensor to be selected, a specific program may be stored or generated in the control unit for controlling the multiplexer structures. The program is fed in with one bit per rising edge of the clock signal, which is not shown separately here but is included in the "control signal" of the figures. In the present case, the program may be "xx10xxx01". It will be understood that the sequence of binary signals in such a program will depend on the specific set-up of the control lines, i.e. the way several multiplexers are connected to each other. When higher-order multiplexers are used instead of 2-1-multiplexers, a different control signal will be required to allow a selection of more than two outputs. In the present example, the first signal value is an enabled bit or '1' fed to the "chip enable" multiplexer. This signal enables the selection of a sensor on the die. A '0' at this point, i.e. on the last position of the example control program, would lead to the open line and thus prevent a closed electric connection with any of the sensors. The second signal is a 0, meaning that the upper set of sensors is chosen. It is seen from the figure that after this second multiplexer, the signals for the multiplexers associated with the four lower sensors are not relevant for the further result. This is why those signals, i.e. the next three signals in the example control sequence, are indicated as a value of 'x'. After running through the three multiplexers of the lower sensor set, the multiplexer is reached which is directly connected to the selected sensor. Therefore, the signal of '0' at this place together with the '1' signal for the next multiplexer completes the electrical connection to the desired sensor. Again, after these multiplexers, the signal for the last multiplexer on the die connected to the remaining pair of sensors is not relevant, since the second-to-last multiplexer has prevented a connection of these sensors. Since only one die is considered in this example, the signal for a subsequent die is again not important and indicated with 'x'. When further dies are connected into the control sequence, the signal sequence may continue with suitable signals in order to select a sensor on another die or to set the chip select signal for a further die to 0, which would prevent selection of more than one sensor.

Inside the analog-digital converter ADC, a current source is activated after programming of the control sequence. The ADC can then sense the voltage over the selected sensor, converting that voltage into a corresponding digital value. Subsequently the digital value is fed to the compensation block, which has individual information on the characteristics of all sensors and calibration information. Using this information, the ADC value is corrected to better correspond to the actual temperature on the die. Finally, the comparator compares this compensated value to the set threshold values and either produces an interrupt or a continuous status signal. On a third output, the compensated sensor value may be given, for instance for archival or long-term follow-up purposes. When an interrupt is generated in response to a sensor reading, the controlling and throttling of resources as described above may be triggered. It shall be noted that the control entity for controlling the resource activity may be included in the interrupt control described in connection with FIGS. 9 to 12 for selecting sensor to be read, but may also in some embodiments be enclosed in a separate hardware and/or software based control which performs the evaluation and throttling functions as described in the above examples.

Figure 11:
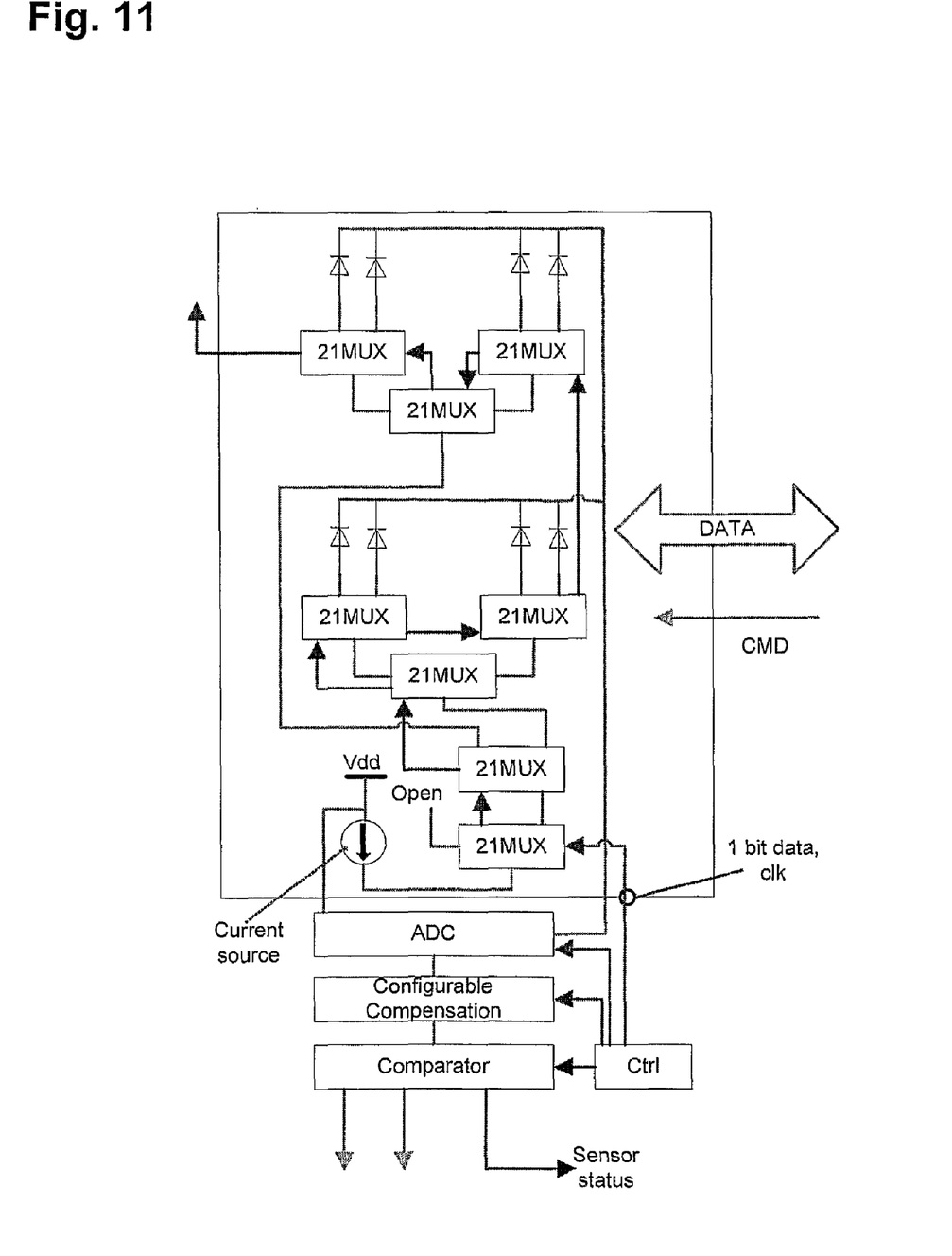
FIG. 11 depicts another embodiment of a sensor sequencing scheme with a die-internal current source.

FIG. 11 is another exemplary embodiment for selecting a single sensor using an external control entity. The electrical connections, control lines and multiplexer arrangements are the same as in FIGS. 9 and 10. Here, a separate current source is included on the die for preventing parasitic effects from long signal path lengths. The analog-digital converter may be chosen such that potential voltage fluctuations due to this do not have any influence. In other embodiments, an additional control element may be included for the current source, such that the current source on a die is only activated when actual sensing of sensors takes place. Such a control is not shown in FIG. 11, but may be implemented e.g. by a simple switch or other control elements.

Figure 12:
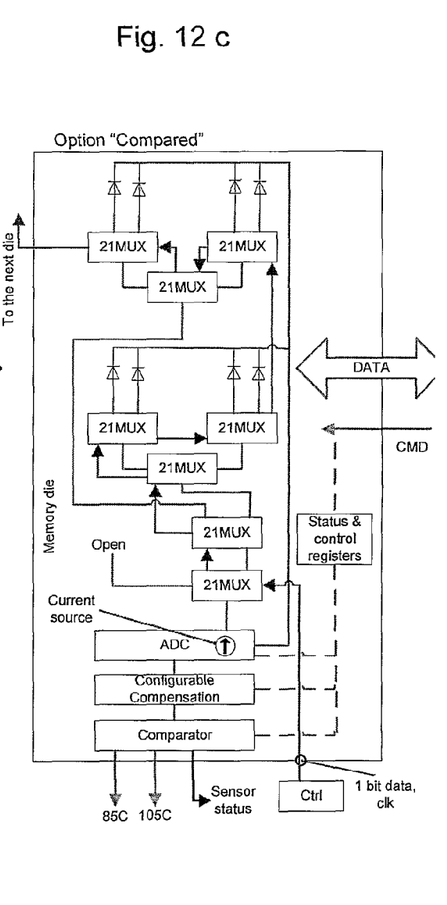
FIGS. 12a-12c depicts three further embodiments of a sensor sequencing scheme with varying control elements on the die.

In FIG. 12, three additional embodiments of the invention are shown. Again, the general structure of all three exemplary setups is similar to that of FIGS. 9 to 11. FIG. 12a shows an example where the analog digital converter ADC is not longer outside the die, but instead included on the die. This means that each die has its own ADC. Otherwise, the control and sensing is performed similar to the embodiment of FIGS. 9 and 10. The current source is again included in the ADC. An additional control line to the ADC, i.e. to the die is used for indicating when to sense a specific sensor. In the next example of FIG. 12b, not only the ADC but also the compensation block is moved onto the die. In this embodiment, the control for compensation and ADC is alternatively done via status and control registers located on the die and connected to the standard command line of the die. It will be understood that this type of control for on-die elements may also be used as an alternative in the embodiment of FIG. 12a, or that the control in FIG. 12 b might still be performed completely by the control block as before. In the last example in FIG. 12c, the comparator is also moved to the die and connected to status and control registers. Only the control block for all sensors remains outside the die.

The selection of a single sensor in an embodiment as in those examples may then be used for implementing sensing and evaluation loops as described above. However, it shall be noted that the above hardware examples are not necessarily restricted to stacked die implementations or to combinations with algorithms as those described above, but may be used in any implementation where a single specific sensor shall be selected and read.

Although exemplary embodiments of the present invention have been described, these should not be construed to limit the scope of the appended claims. Those skilled in the art will understand that various modifications may be made to the described embodiments and that numerous other configurations or combinations of any of the embodiments are capable of achieving this same result. Moreover, to those skilled in the various arts, the invention itself will suggest solutions to other tasks and adaptations for other applications. It is the applicant's intention to cover by claims all such uses of the invention and those changes and modifications which could be made to the embodiments of the invention herein chosen for the purpose of disclosure without departing from the spirit and scope of the invention.

The invention claimed is:

1. A method comprising
obtaining temperature values from at least two thermal sensors arranged on resources within a three-dimensional die structure;
determining at least a partial three-dimensional temperature distribution for said die structure; and
controlling activity of said resources of said dies in response to said three-dimensional temperature distribution.

2. The method of claim 1, wherein said determining includes
comparing temperature values of said at least two thermal sensors with each other;
locating at least one heat source based on said comparing;
identifying at least one resource associated with said at least one heat source; and
wherein said controlling of activity includes throttling activity at least in said at least one identified resource.

3. The method of claim 2, wherein said activity is throttled if said at least one temperature value associated with said at least one identified resources is above a predefined threshold.

4. The method of claim 2, wherein said identifying includes identifying a resource associated with the highest of said compared temperature values.

5. The method of claim 1, further comprising receiving a signal indicating a temperature value above a second predefined threshold.

6. The method of claim 1, further comprising continuously sensing said temperature values.

7. The method of claim 5, further comprising sensing said temperature values in response to said received signal.

8. The method of claim 6, further comprising selecting a specific sensor to be sensed.

9. The method of claim 8, further comprising providing a control sequence signal for switching elements connected to said sensor.

10. The method of claim 9, wherein said switching elements comprise multiplexers.

11. The method of claim 1, further comprising
selecting a specific sensor for evaluation;
wherein said obtained temperature values include a selected temperature value sensed by said selected sensor; and
wherein said comparing comprises comparing said selected temperature value to at least a further one of said obtained temperature values; and
issuing a throttle order for a resource associated with said selected sensor if said selected temperature value is determined to be the highest value in said comparing.

12. The method of claim 11, further comprising issuing a throttle request for a defined further resource if a temperature value associated with said further resource is higher than said selected temperature value.

13. The method of claim 1, further comprising checking whether a throttle request exists for a selected resource.

14. The method of claim 13, further comprising
comparing a selected temperature value associated with said selected resource to a second temperature value associated with the resource which has issued said throttle request; and
issuing a throttle order for said selected resource if said selected temperature value is higher than said second temperature value.

15. The method of claim 2, wherein said throttling is triggered by a binary throttle order associated with a specific resource.

16. The method of claim 1, further comprising determining a measure of confidence that at least a selected resource needs to be throttled.

17. The method of claim 16, wherein said measure of confidence is included in a throttle order.

18. The method of claim 12, wherein said throttle request is a binary value associated with a requesting resource.

19. The method of claim 2, wherein at least one of said comparing or said throttling is based on information on relative sensor locations within said die structure.

20. The method of claim 1, wherein said at least two temperature values are obtained from adjacent sensors within said die structure.

21. A computer program product including computer program code which, when executed, causes a device to execute a method according to claim 1.

22. A method comprising
obtaining temperature values from a number of selected thermal sensors located on dies within a three-dimensional die structure;
determining at least a partial three-dimensional temperature distribution for said die structure;
controlling activity of resources of said dies in response to said three-dimensional temperature distribution.

23. A device comprising
at least two semiconductor dies packaged together in a three-dimensional die structure;
at least one thermal sensor located on each of said dies;
a control unit connected to and controlling said thermal sensors;
wherein said control unit is adapted to obtain temperature values sensed by said thermal sensors;
determine at least a partial three-dimensional temperature distribution for said die structure; and
issue throttle orders for resources on said dies in dependence of said temperature distribution.

24. The device of claim 23, wherein said control unit is further adapted to sense a selected thermal sensor.

25. The device of claim 23, wherein said control unit is adapted to continuously evaluate at least a part of said thermal sensors, said evaluation including said determining of a temperature distribution and said issuing of throttle orders.

26. The device of claim 23, further comprising a memory element configured for storing said throttle orders.

27. The device of claim 23, further comprising a memory element configured for storing said temperature values or said temperature distribution.

28. The device of claim 23, further comprising switching elements coupled between said control unit and said thermal sensors, said switching elements being configured for selecting a specific thermal sensor.

29. The device of claim 28, wherein said switching elements comprise multiplexers.

30. The device of claim 28, wherein said switching elements are arranged such that only a single sensor at a time is connected to said control unit.

31. The device of claim 23, said device further including a sensing unit.

32. The device of claim 31, wherein said sensing unit comprises an analog-to-digital converter.

33. The device of claim 23, wherein said thermal sensor comprises a thermal diode.

34. The device of claim 31, wherein said sensing unit is coupled to a compensation unit configured for modifying values sensed by said sensing unit.

35. The device of claim 31, wherein said sensing unit or said compensation unit are coupled to a comparator configured for comparing values sensed by said sensing unit.

36. The device of claim 31, wherein said control unit includes at least one of said sensing unit, said compensation unit and said comparator.

37. The device of claim 23, wherein said control unit is implemented via software code.

* * * * *